United States Patent
Fujii et al.

(10) Patent No.: US 8,562,112 B2
(45) Date of Patent: Oct. 22, 2013

(54) PIEZOELECTRIC ACTUATOR, METHOD OF DRIVING SAME, LIQUID EJECTION APPARATUS AND PIEZOELECTRIC ULTRASONIC OSICLLATOR

(75) Inventors: Takamichi Fujii, Ashigarakami-gun (JP); Yoshikazu Hishinuma, Ashigarakami-gun (JP); Yoshinori Katoh, Ashigarakami-gun (JP); Takami Arakawa, Ashigarakami-gun (JP); Takayuki Naono, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 252 days.

(21) Appl. No.: 12/892,904

(22) Filed: Sep. 28, 2010

(65) Prior Publication Data
US 2011/0074888 A1 Mar. 31, 2011

(30) Foreign Application Priority Data
Sep. 30, 2009 (JP) ................. 2009-226706

(51) Int. Cl.
*B41J 2/045* (2006.01)
(52) U.S. Cl.
USPC .......................................................... 347/68
(58) Field of Classification Search
None
See application file for complete search history.

(56) References Cited

U.S. PATENT DOCUMENTS

| 7,141,911 B2 * | 11/2006 | Kita et al. ..................... 310/317 |
| 2005/0052482 A1 | 3/2005 | Ito et al. |
| 2008/0178443 A1 * | 7/2008 | Tokukura ..................... 29/25.35 |

FOREIGN PATENT DOCUMENTS

| JP | 2003-243741 | 8/2003 |
| JP | 2008-218547 | 9/2008 |
| WO | 03-022582 | 3/2003 |

* cited by examiner

*Primary Examiner* — Matthew Luu
*Assistant Examiner* — Erica Lin
(74) *Attorney, Agent, or Firm* — Fish & Richardson P.C.

(57) ABSTRACT

A method of driving a piezoelectric actuator including: a piezoelectric element containing a piezoelectric body having coercive field points on a negative field side and a positive field side respectively and having asymmetrical bipolar polarization—electric field hysteresis characteristics in which an absolute value of a coercive electric field on the negative field side and a coercive electric field value on the positive field side are mutually different, and a pair of electrodes for applying voltage to the piezoelectric body; and a diaphragm which externally transmits, as displacement, distortion produced in the piezoelectric body when the voltage is applied to the piezoelectric body, includes the step of driving the piezoelectric actuator between a positive drive voltage and a negative drive voltage in a range not exceeding the coercive electric field, from among the positive and negative coercive electric fields, which has the larger absolute value.

10 Claims, 6 Drawing Sheets

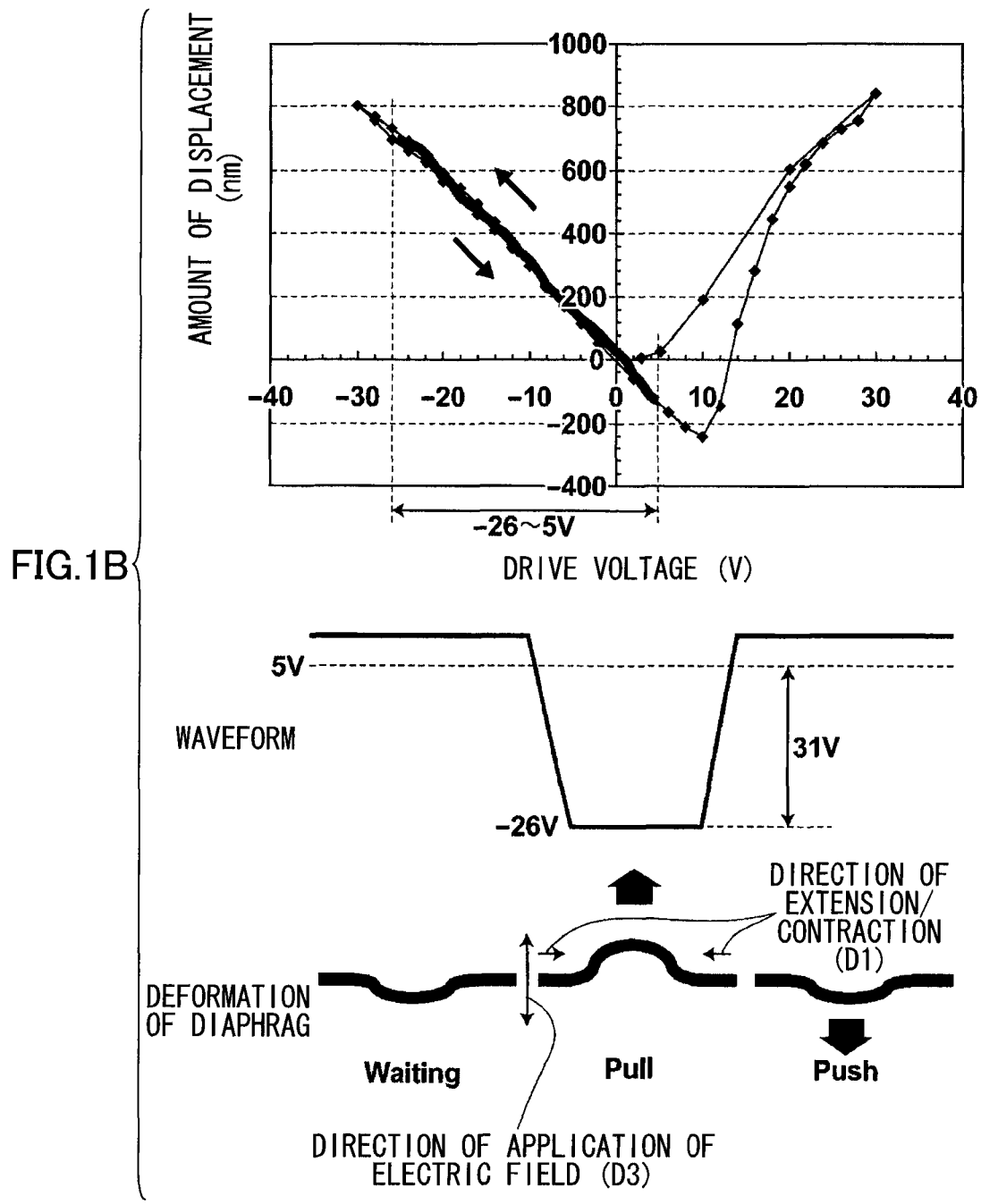

PIEZOELECTRIC ACTUATOR, METHOD OF DRIVING SAME, LIQUID EJECTION APPARATUS AND PIEZOELECTRIC ULTRASONIC OSICLLATOR

BACKGROUND OF THE INVENTION

1. Field of the Invention

The present invention relates to a method of driving a piezoelectric actuator including a piezoelectric body which has respective coercive electric field points on a negative field side and a positive field side, and has asymmetrical bipolar polarization/field hysteresis characteristics in which an absolute value of the coercive electric field on the negative field side and the coercive electric field value on the positive field side are mutually different, and also relates to a piezoelectric actuator used in this drive method, a liquid ejection apparatus using this piezoelectric actuator, and a piezoelectric type ultrasonic oscillator.

2. Description of the Related Art

A piezoelectric element which comprises a piezoelectric body having piezoelectric characteristics whereby the body expands and contracts with increase and decrease in the intensity of an applied electric field, and an electrode which applies an electric field to the piezoelectric body, is used in applications such as piezoelectric actuators mounted in inkjet type recording heads. For the piezoelectric material, a perovskite type oxide is commonly used, and of this, a lead titanate zirconate (PZT) type of perovskite oxide is known to have high piezoelectric characteristics (piezoelectric d constant).

The bipolar polarization/field curve (P-E hysteresis) of a general piezoelectric body is substantially symmetrical with respect to the y axis which indicates the polarization value, and the coercive electric field $Ec1$ on the negative field side and the coercive electric field $Ec2$ on the positive field side are substantially equal ($|Ec1|{\approx}Ec2$).

On the other hand, the P-E hysteresis of a piezoelectric film, or the like, made of a PZT type perovskite oxide which is deposited by a vapor deposition method such as sputtering, is biased toward the positive field side, in other words, is asymmetrical with respect to the y axis, and the absolute value of the coercive electric field $Ec1$ on the negative field side and the coercive electric field $Ec2$ on the positive field side are different ($|Ec1|{\neq}Ec2$) (see FIG. 1A). A piezoelectric body which displays P-E hysteresis characteristics of this kind produces a very large polarization upon application of a slight negative voltage during negative driving, but only produces slight polarization during positive driving, even when applying a positive voltage having the same absolute value as the negative voltage that has been applied.

As described above, in a piezoelectric body having P-E hysteresis which is asymmetrical with respect to the y axis, it is possible to obtain high piezoelectric performance by actively utilizing this asymmetry, in other words, by driving the body by applying an electric field of the polarity where the absolute value of the coercive electric field is smaller. A piezoelectric actuator having a piezoelectric body of this kind is desirable from the viewpoint of being able to yield large displacement, but in order to obtain a large displacement by means of a normal method of driving a piezoelectric actuator which is driven from zero within the range of the electric field $Emax$ ($0{\leq}E{\leq}|Emax|$) which indicates the maximum displacement on the electric field side of the polarity having the smaller absolute value of the coercive electric field, it is necessary to apply a large electric field (voltage), and hence there are possibilities that the load on the piezoelectric body is large, and the drive durability and the element reliability becomes poor.

Japanese Patent Application Publication No. 2003-243741 and Japanese Patent Application Publication No. 2008-218547 disclose a piezoelectric element which actively utilizes the asymmetrical P-E hysteresis characteristics. Japanese Patent Application Publication No. 2003-243741 discloses a piezoelectric body having P-E hysteresis characteristics in which two coercive electric field points are both situated on the same field polarity.

If a piezoelectric body having coercive electric fields $Ec1$ and $Ec2$ with opposite polarities is driven by a single polarity in this way, by the normal piezoelectric actuator driving described above ($0{\leq}E{\leq}|Emax|$), then the displacement on the opposite side to the driving polarity is not used and creates loss; however, in the piezoelectric body described in Japanese Patent Application Publication No. 2003-243741, the two coercive electric field points are situated on the same polarity, and therefore it is possible to make effective use of displacement that is lost in a normal piezoelectric body.

Furthermore, Japanese Patent Application Publication No. 2008-218547 discloses a piezoelectric body having asymmetrical P-E hysteresis, and materials and design for same, the piezoelectric body having hysteresis characteristics whereby the drive voltage and the gradient of the displacement become a maximum, thus obtaining a piezoelectric body having low displacement loss and low power loss and excellent durability with long use compared to the piezoelectric body described in Japanese Patent Application Publication No. 2003-243741.

However, in Japanese Patent Application Publication No. 2003-243741 and Japanese Patent Application Publication No. 2008-218547, the material is designed to improve the P-E hysteresis and field-distortion curve characteristics, in such a manner that a large displacement is obtained efficiently. Consequently, Japanese Patent Application Publication No. 2003-243741 and Japanese Patent Application Publication No. 2008-218547 do not reduce the load on the piezoelectric body by efficient driving of a currently available piezoelectric body having asymmetrical P-E hysteresis, such as PZT or the like.

On the other hand, International Publication WO 2003/022582 discloses a liquid ejection apparatus which applies a drive waveform including a high potential period during which a voltage producing an electric field intensity exceeding the coercive electric field of the piezoelectric body is applied, and an inverse potential period during which a voltage of inverse polarity to the voltage of the high potential period is applied. International Publication WO 2003/022582 discloses, in FIG. 9 and the explanation relating to FIG. 9 (the first embodiment from page 8 to page 9), that, by applying a drive waveform having an inverse potential period, a large displacement is obtained, even with the same amount of change in the electric field, and furthermore that sufficient displacement can be obtained without being susceptible to the effects of change in the hysteresis curve due to the multiple driving actions. However, International Publication WO 2003/022582 does not describe the application of a piezoelectric actuator comprising a piezoelectric body having asymmetrical P-E hysteresis.

SUMMARY OF THE INVENTION

The present invention has been contrived in view of the foregoing circumstances, an object thereof being to provide a method of driving a piezoelectric actuator which is capable of driving a piezoelectric actuator based on a piezoelectric body having asymmetrical bipolar polarization—electric field hysteresis characteristics, at a voltage (absolute value) lower than the drive voltage required when driving by a normal driving method, and to provide a piezoelectric actuator to which this driving method can be applied appropriately, a liquid ejection apparatus comprising the piezoelectric actuator, and a piezoelectric ultrasonic oscillator.

In order to attain an object described above, one aspect of the present invention is directed to a method of driving a piezoelectric actuator including: a piezoelectric element containing a piezoelectric body having coercive field points on a negative field side and a positive field side respectively and having asymmetrical bipolar polarization—electric field hysteresis characteristics in which an absolute value of a coercive electric field on the negative field side and a coercive electric field value on the positive field side are mutually different, and a pair of electrodes for applying voltage to the piezoelectric body; and a diaphragm which externally transmits, as displacement, distortion produced in the piezoelectric body when the voltage is applied to the piezoelectric body, the method comprising the step of driving the piezoelectric actuator between a positive drive voltage and a negative drive voltage in a range not exceeding the coercive electric field, from among the positive and negative coercive electric fields, which has the larger absolute value.

Here, the term "asymmetrical" means that the bipolar polarization—electric field hysteresis characteristics are asymmetrical with respect to the y axis which indicates the polarization value.

Furthermore, "a range not exceeding the coercive electric field, from among the positive and negative coercive electric fields, which has the larger absolute value" means a range of equal to or less than the coercive electric field in the case where the coercive electric field is on the positive side and a range of equal to or greater than the coercive electric field in the case where the coercive electric field is on the negative side.

Desirably, the piezoelectric actuator is driven while a drive voltage having a polarity of the coercive electric field, from among the positive and negative coercive electric fields, which has the larger absolute value, is constantly applied to the piezoelectric body as a bias voltage.

Desirably, the piezoelectric actuator is driven under conditions satisfying following Expression (1): $|Vc1|<|Vc2|$ ... (1) where $Vc1$ denotes a drive voltage having the polarity of the coercive field, from among the positive and negative coercive electric fields, which has the larger absolute value, and $Vc2$ denotes a drive voltage having the polarity of the coercive field, from among the positive and negative coercive electric fields, which has the smaller absolute value.

Desirably, the piezoelectric actuator is driven under conditions satisfying following Expression (2): $|Vc1|\leq 0.7\times|V1|$ ... (2) where $Vc1$ denotes a drive voltage having the polarity of the coercive field, from among the positive and negative coercive electric fields, which has the larger absolute value, and $V1$ denotes a product of the coercive electric field $E1$ of the same sign as $Vc1$ and a thickness of the piezoelectric body in a direction of application of voltage.

Desirably, the piezoelectric body contains Pb.

Desirably, the piezoelectric actuator is driven in a mode where a direction of application of voltage to the piezoelectric body and a direction of expansion and contraction of the piezoelectric body are mutually perpendicular.

Here, "a mode where a direction of application of voltage to the piezoelectric body and a direction of expansion and contraction of the piezoelectric body are mutually perpendicular" means a so-called 31 direction driving.

Desirably, the voltage applied to the piezoelectric body has a square waveform.

In order to attain an object described above, one aspect of the present invention is directed to a piezoelectric actuator comprising: a piezoelectric element including a piezoelectric body having coercive field points on a negative field side and a positive field side respectively and having asymmetrical bipolar polarization—electric field hysteresis characteristics in which an absolute value of a coercive electric field on the negative field side and an absolute value of a coercive electric field on the positive field side are mutually different, and a pair of electrodes for applying voltage to the piezoelectric body; a diaphragm which externally transmits, as displacement, distortion produced in the piezoelectric body when the voltage is applied to the piezoelectric body; and a drive device which drives the piezoelectric element, wherein the piezoelectric actuator has voltage displacement characteristics of 10% or less linearity within a driving range when the piezoelectric actuator is driven.

Here, "voltage displacement characteristics of 10% or less linearity" means that, as shown in FIG. 8, when the voltage—displacement curve obtained in practice is approximated to a straight line by fitting using a least squares method, the largest value between the actual displacement value and the distortion value of the straight line approximation (indicated as "non-linearity error" in FIG. 8), is 10% or less of the range of the displacement of the voltage—displacement curve after fitting (the "full scale" indicated in FIG. 8).

In the piezoelectric actuator according to an aspect of the present invention, the example given for the piezoelectric body is a piezoelectric film (the piezoelectric film may contain unavoidable impurities) composed of one type or a plurality of types of perovskite oxides represented by the General Formula (P) below, which is deposited on the substrate by sputtering using a plasma, and a piezoelectric film (the piezoelectric film may contain unavoidable impurities) composed of one type or a plurality of types of perovskite oxides represented by the General Formula (P-1) below is more desirable. This piezoelectric film has piezoelectric characteristics in which the polarity of the coercive electric field having a smaller absolute value is negative and the P-E hysteresis is biased toward the positive field side.

$$A_aB_bO_3 \quad \text{General Formula (P)}$$

(In the Formula (P), A is an A site element of which the main component is Pb; B is a B site element, and is at least one type of element selected from the group comprising Ti, Zr, V, Nb, Ta, Cr, Mo, W, Mn, Sc, Co, Cu, In, Sn, Ga, Zn, Cd, Fe and Ni; O is oxygen; and a case where $a\geq 1.0$ and $b=1.0$ is standard, but these figures may deviate from 1.0 within a range where a perovskite structure is maintained.)

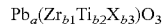
$$Pb_a(Zr_{b1}Ti_{b2}X_{b3})O_3 \quad \text{General Formula (P-1)}$$

(In the Formula (P-1), X is at least one type of metal element selected from the V and VI groups; $a>0$, $b1>0$, $b2>0$, $b3\geq 0$; and a case where $a\geq 1.0$ and $b1+b2+b3=1.0$ is standard, but these figures may deviate from 1.0 within a range where a perovskite structure is maintained.)

In the General Formulas (P) or (P-1) above, desirably, $a>1.02$.

Desirably, a bias rate of the asymmetrical bipolar polarization—electric field hysteresis characteristics is 20% or greater.

In order to attain an object described above, one aspect of the present invention is directed to a liquid ejection apparatus comprising: any one of the piezoelectric actuators above; and a liquid ejection member provided integrally with or adjacently to the piezoelectric actuator, wherein the liquid ejection member includes a liquid storage chamber in which liquid is stored and a liquid ejection port by which the liquid is ejected to an exterior from the liquid storage chamber.

In order to attain an object described above, one aspect of the present invention is directed to a piezoelectric ultrasonic oscillator comprising: any one of the piezoelectric actuators above; and an AC power source which applies an alternating current to the pair of electrodes, wherein the diaphragm vibrates due to expansion and contraction of the piezoelectric body.

It is stated above that International Publication WO 2003/022582 describes improving the driving durability of a piezoelectric actuator by driving the piezoelectric actuator with a drive waveform including a high potential period and a reverse potential period, in other words, by driving between a positive drive voltage and a negative drive voltage, but International Publication WO 2003/022582 makes no mention of application to a piezoelectric actuator comprising a piezoelectric body having asymmetrical P-E hysteresis.

However, the object of International Publication WO 2003/022582 is to displace the position of the hysteresis in the application of voltage in the reverse potential period to a position where displacement can be obtained more efficiently, and driving durability is improved by driving in a range which is not affected by deterioration of the hysteresis, based on the premise that there is no change in the maximum amount of displacement.

If it is sought to drive a piezoelectric actuator comprising a piezoelectric body having asymmetrical P-E hysteresis and high piezoelectric characteristics by using the piezoelectric characteristics to the maximum limit, then the voltage applied to the piezoelectric body is very high and a great load is placed on the piezoelectric body, which results in very rapid deterioration of the displacement. The inventors made a thorough study of driving methods which can be used to drive a piezoelectric actuator comprising a piezoelectric body having asymmetrical P-E hysteresis and high piezoelectric characteristics, while suppressing decline in the durability of the piezoelectric body, and discovered that driving durability is improved dramatically with better drive characteristics. More specifically, the present invention differs in conception from International Publication WO 2003/022582 in that it improves the driving durability and element reliability of a piezoelectric actuator by reducing the load applied to a piezoelectric body of this kind when the piezoelectric body is driven.

Furthermore, with a normal drive method, under conditions of high humidity and high temperature, ions present in the piezoelectric film (for example, positive lead ions) migrate to one side, which may be a cause of insulation breakdown. According to the driving method of the present invention, the driving is performed on both the positive and negative sides, and bias of the ions can be greatly restricted and therefore driving durability is improved dramatically. Such ion migration is particularly liable to occur in a piezoelectric body having a composition which is far from a stoichiometric state. Consequently, in a piezoelectric element comprising a piezoelectric body having a composition of this kind, beneficial effects of the present invention in improving driving durability are very great indeed. For example, if the piezoelectric body contains lead (Pb), then particularly beneficial effects are obtained if the lead content is greater than the stoichiometric content (in the case of a perovskite oxide, a composition where the mol ratio of lead with respect to oxygen is $1/3$ or greater).

As described previously, the present invention improves the drive characteristics (removal volume) of a piezoelectric body at the same time as preventing bias in the material caused by ion migration in the piezoelectric body which occurs during driving, and therefore to differs from a method which improves drive characteristics only.

As described above, the driving method for a piezoelectric actuator according to the present invention drives a piezoelectric actuator including: a piezoelectric body having respective coercive electric field points on the negative field side and the positive field side, and asymmetrical bipolar polarization—field hysteresis characteristics in which the absolute value of the coercive electric field on the negative field side is different from the coercive electric field value on the positive field side, the piezoelectric actuator being driven between a positive drive voltage and a negative drive voltage in a range not exceeding the coercive electric field, from among the positive and negative coercive electric fields, which has the larger absolute value. According to this method, it is possible to drive an actuator at a voltage (absolute value) lower than the drive voltage required when driving is carried out by a normal driving method, and therefore it is possible to improve the driving durability and the element reliability of the piezoelectric actuator by reducing the load on the piezoelectric body.

In particular, if the driving method of the present invention is applied to an actuator comprising a piezoelectric body having voltage displacement characteristics of 10% or less linearity in the driving range, then it is possible to obtain a large amount of displacement with good efficiency, at a low drive voltage (absolute value).

BRIEF DESCRIPTION OF THE DRAWINGS

FIG. 1B is a schematic drawing showing the voltage—displacement characteristics upon driving an actuator suitably by the method of driving a piezoelectric actuator according to an embodiment of the present invention (the voltage—displacement characteristics when a piezoelectric actuator is driven according to a first example) and the input waveform and state of displacement of the diaphragm when the piezoelectric body is driven;

DESCRIPTION OF THE PREFERRED EMBODIMENTS

Method for Driving Piezoelectric Actuator

A method of driving a piezoelectric actuator according to an embodiment of the present invention is a method of driving a piezoelectric actuator comprising a piezoelectric body which has respective coercive electric field points on a negative field side and a positive field side, and has asymmetrical bipolar polarization—electric field hysteresis characteristics (P-E hysteresis characteristics) according to which the absolute value $|Ec1|$ of the coercive electric field $Ec1$ on the negative field side and the coercive electric field value $Ec2$ on the positive field side are different, in other words, a piezoelectric body having P-E hysteresis characteristics in which the P-E hysteresis is biased toward the positive field side or the negative field side. In the present embodiment, a piezoelectric actuator comprising a piezoelectric body having P-E hysteresis biased toward the positive field side is used as an example, but it is possible to obtain similar action and beneficial effects in a piezoelectric body having P-E hysteresis biased toward the negative field side, except that the signs of the values will be different.

Figure 1A:
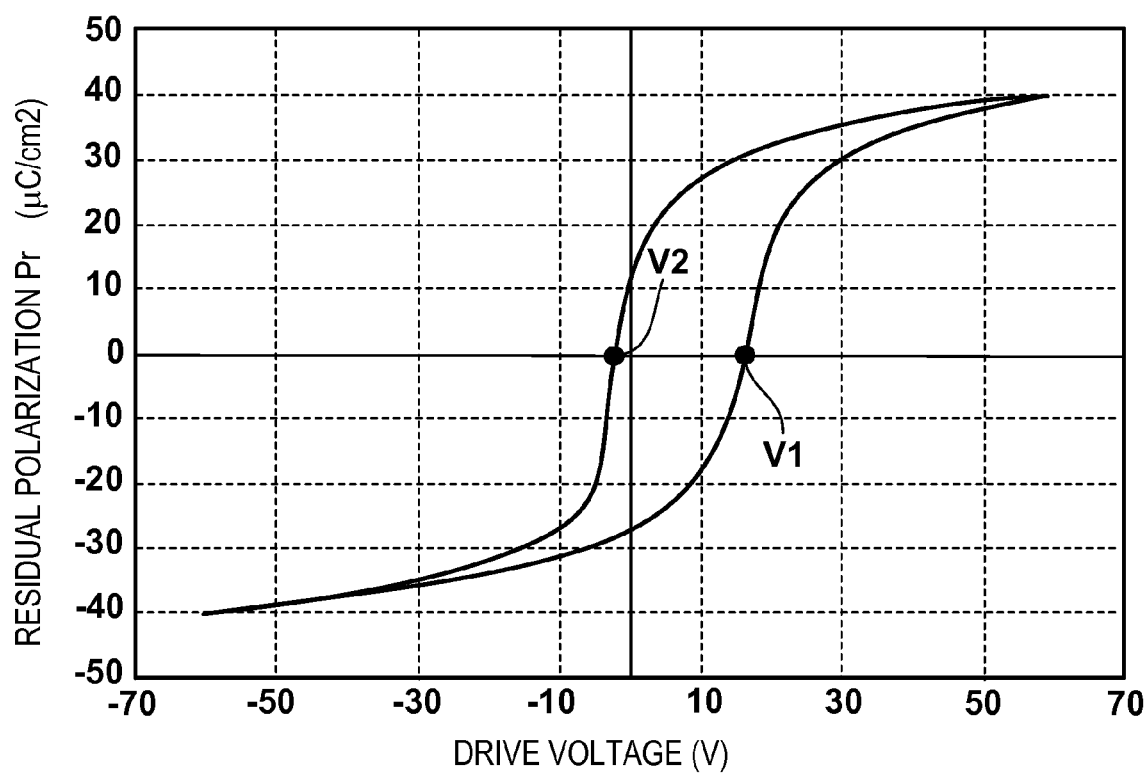
FIG. 1A is a diagram showing one example of P-E hysteresis characteristics of a piezoelectric body using a driving method for a piezoelectric actuator according to an embodiment of the present invention.

One example of a method of driving a piezoelectric actuator according to an embodiment of the present invention is described here with reference to the drawings. FIG. 1A shows P-E hysteresis characteristics which are asymmetrical to the y axis that represents polarization and have respective coercive electric field points on the negative field side and the positive field side of the P-E hysteresis which is biased toward the positive field side (these are the P-E hysteresis characteristics of the piezoelectric film according to the first embodiment which is described below).

In FIG. 1A, the coercive electric field $Ec1$ on the negative field side and the coercive electric field $Ec2$ on the positive field side have the relationship $|Ec1|<Ec2$. Concerning a piezoelectric film having asymmetrical P-E hysteresis biased toward the positive field side in this way, when a positive electric field is applied, it is difficult to achieve polarization because the coercive electric field $Ec2$ is large, and when a negative electric field is applied, polarization can be achieved readily because the absolute value of the coercive electric field $Ec1$ is small.

The method of driving a piezoelectric actuator according to the present embodiment of the invention can be applied desirably to a piezoelectric actuator comprising a piezoelectric body having P-E hysteresis with a bias rate of 20% or greater, and the higher this bias rate, the greater the effect achieved. The bias rate of the P-E hysteresis shown in FIG. 1A is 76%.

Here, the "bias rate" means the value calculated by the formula given below. In the present embodiment, the piezoelectric body has P-E hysteresis characteristics biased toward the positive field side, and therefore the bias rate is the value obtained by the following formula; however, in the case of a piezoelectric body having P-E hysteresis characteristics biased toward the negative field side, the bias rate is the absolute value of the value obtained by the following formula.

$$(Ec2+Ec1)/(Ec2-Ec1)\times 100(\%)$$

According to the method of driving a piezoelectric actuator according to the present embodiment, a piezoelectric actuator comprising a piezoelectric body having these P-E hysteresis characteristics is driven between a positive drive voltage and a negative drive voltage. Here, the negative drive voltage can be set to any voltage at which the desired displacement is obtained, within a range up to the electric field Emax which displays maximum displacement, but the positive drive voltage is within a range that does not exceed $Ec2$.

FIG. 1B shows the bipolar field—displacement hysteresis characteristics in the case of actually driving a piezoelectric actuator comprising a piezoelectric film having the P-E hysteresis characteristics in FIG. 1A. FIG. 1B shows the field—displacement hysteresis obtained by driving a piezoelectric actuator which is actually manufactured in the first embodiment described below, and this displays high linearity without hardly any history on the negative field side (1% or less). The piezoelectric driving method according to the present invention is most effective in driving a piezoelectric actuator having highly linear drive characteristics in the driving range in this way, but the presence or absence of hysteresis and the linearity in the driving range are not limited to these conditions.

As shown in FIG. 1B, in the present embodiment, the piezoelectric actuator is driven in a range of −26V (the voltage which gives Emax) to 5V. There are no particular restrictions on the method for applying the voltage, and it is possible to previously apply a bias voltage on the positive side to the piezoelectric actuator, and to drive the piezoelectric actuator by inputting a square wave which reaches a desired negative voltage.

FIG. 1B shows an example of a waveform of the square wave which is input, together with a schematic drawing of the state of displacement of the piezoelectric actuator in the case of positive and negative voltages.

In the present embodiment, a positive bias voltage is applied, and therefore a positive voltage is applied at all times. Consequently, when in a standby state (the "Waiting" state in FIG. 1B), the displacement of the vibrating surface (diaphragm) of the piezoelectric actuator has a projected shape in the downward direction. On the other hand, when a negative voltage is applied in the D3 direction, the piezoelectric body expands/contracts in the direction D1 perpendicular to the D3 direction and assumes an upwardly projected state ("Pull" in FIG. 1B), the maximum displacement being achieved when a voltage of −26V is applied (31 direction mode). When the application of the voltage is released, the diaphragm assumes a downwardly projected shape similarly to a standby state ("Push" in FIG. 1B).

Figure 1C:
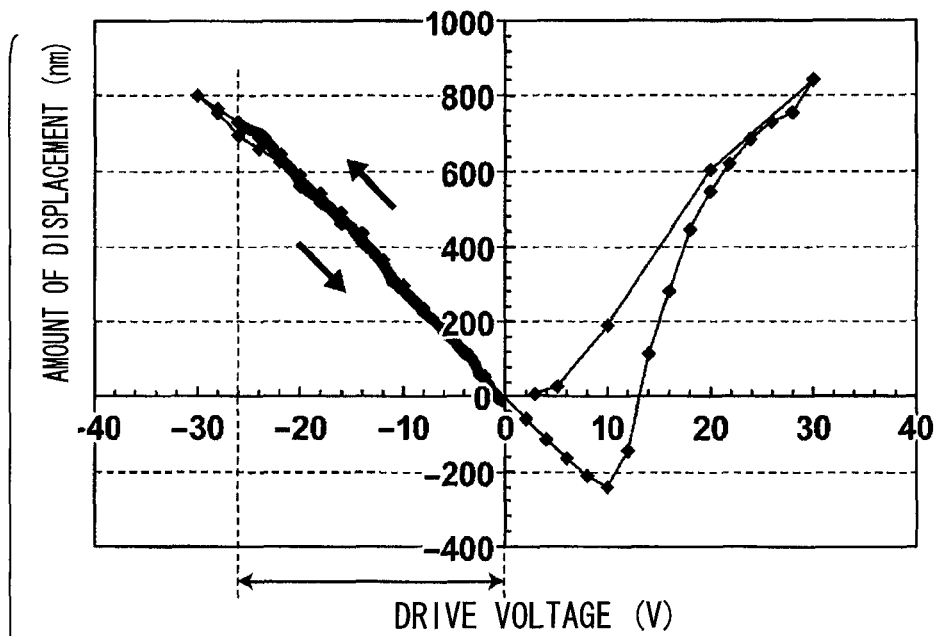
FIG. 1C is a schematic drawing showing the input waveform and displacement of the diaphragm when the piezoelectric body in FIG. 1B is driven by a normal driving method.
Figure 1C:
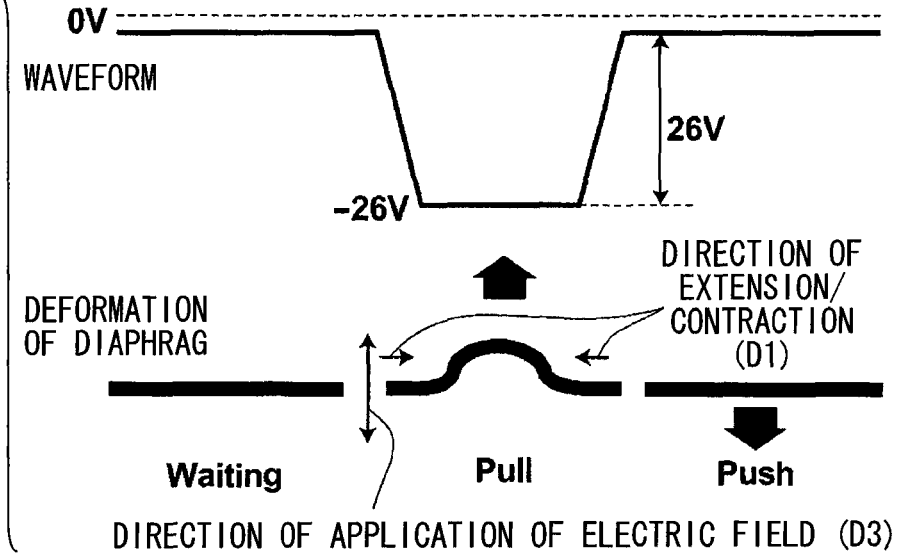

FIG. 1C shows the waveform and the displacement of the vibrating surface of an actuator in the case of a normal driving method, in other words, when the driving is performed in a range of 0≤E≤Emax (−26V). In FIG. 1C, when a voltage of −26V which displays maximum displacement is applied, an amplitude corresponding to 26V only is obtained, but in FIG. 1B where the actuator is driven by the driving method of the present embodiment, an amplitude corresponding to 31V is obtained by applying −26V. In this way, if the actuator is driven in a so-called 31 direction mode, where the direction of application of the voltage applied to the piezoelectric body and the direction of expansion/contraction of the piezoelectric body are perpendicular, it is possible to obtain a large removal volume, and therefore the driving method according to the present embodiment is particularly beneficial in such cases.

Consequently, according to the driving method of the present embodiment, it is possible to obtain a desired displacement by means of a voltage which places a smaller load on the piezoelectric body than a normal driving method, and furthermore, it is also possible to obtain a displacement exceeding the maximum displacement estimated from the piezoelectric characteristics of the piezoelectric film, by applying Emax at which the maximum displacement is obtained.

In the driving method according to the present embodiment, desirably, the actuator is driven under conditions which satisfy Expression (1) below. Furthermore, since the amount of displacement becomes less in the vicinity of the coercive electric field at which the polarization is reversed, then desirably, the drive voltage Vc1 having the polarity of the coercive electric field, from among the positive and negative coercive electric fields, which has the larger greater absolute value (in the present embodiment, the positive drive voltage) is used as a drive voltage which applies an electric field equal to or lower than 70% of Ec1.

$$|Vc1|<|Vc2| \quad (1)$$

where Vc1 is a drive voltage having the polarity of the coercive field, from among the positive and negative coercive electric fields, which has the larger absolute value, and Vc2 is a drive voltage having the polarity of the coercive field, from among the positive and negative coercive electric fields, which has the smaller absolute value.

$$|Vc1|\leq 0.7\times|V1| \quad (2)$$

where V1 is the product of the coercive electric field E1 of the same sign as Vc1 and the thickness of the piezoelectric body in the direction of application of voltage.

Furthermore, if a piezoelectric body made of a perovskite oxide containing lead and having high piezoelectric characteristics (the piezoelectric body may include unavoidable impurities) is used as the piezoelectric body of the piezoelectric actuator, then when the actuator is driven, the Pb ions present in the piezoelectric film generate ion migration which is biased to one side provided that driving is normal, and therefore insulation breakdown is liable to occur and element characteristics are liable to deteriorate when it is used under high-temperature and high-humidity conditions in particular.

The method of driving a piezoelectric actuator according to the present embodiment drives the actuator between a negative electric field and a positive electric field, and therefore ion bias, in other words, ion migration is suppressed to a great extent, and driving durability is thereby markedly improved. Ion migration is particularly liable to occur in a piezoelectric body having a composition which is far removed from a stoichiometric state. Consequently, in a piezoelectric element comprising a piezoelectric body having a composition of this kind, beneficial effects of the present embodiment in improving driving durability are very great indeed.

Therefore, in a case where a driving method according to the present embodiment is employed in an actuator comprising a piezoelectric body including lead, it is possible to reduce deterioration due to lead migration, in addition to reducing deterioration due to the load on the piezoelectric body, and consequently the driving durability and element reliability of the actuator can be improved more effectively. A piezoelectric body which is suitable for the method of driving a piezoelectric actuator according to the present embodiment is described below.

As described above, the method of driving a piezoelectric actuator according to the present embodiment drives a piezoelectric actuator comprising a piezoelectric body having respective coercive electric field points on the negative field side and the positive field side, and asymmetrical bipolar polarization—field hysteresis characteristics in which the absolute value of the coercive electric field on the negative field side is different from the coercive electric field value on the positive field side, the piezoelectric actuator being driven between a positive drive voltage and a negative drive voltage in a range not exceeding the coercive electric field, from among the positive and negative coercive electric fields, which has the larger absolute value. According to this method, it is possible to drive an actuator at a voltage (absolute value) lower than the drive voltage required when the driving is performed by a normal driving method, and therefore it is possible to reduce the load on the piezoelectric body and improve the driving durability and the element reliability of the piezoelectric actuator.

In particular, if the driving method of the present embodiment is applied to an actuator comprising a piezoelectric body having voltage displacement characteristics of 10% or less linearity in the driving range, then it is possible to obtain a large amount of displacement with good efficiency, at a low drive voltage (absolute value).

Piezoelectric Actuator and InkJet Recording Head

Figure 2:
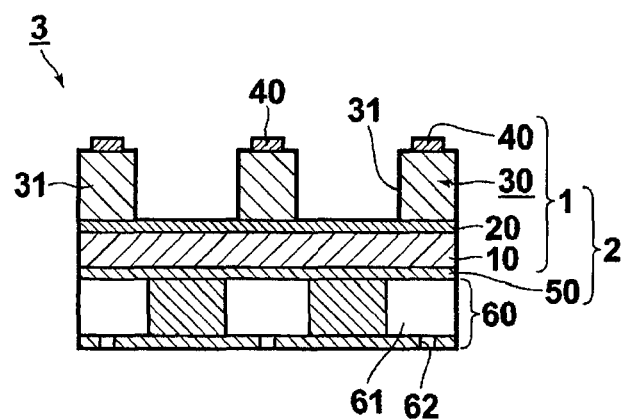
FIG. 2 is a partial cross-sectional diagram showing the structure of a piezoelectric actuator according to one embodiment of the present invention, and an inkjet head (liquid ejection apparatus) comprising same.

Referring to FIG. 2, the structure of a piezoelectric actuator, and an inkjet recording head (liquid ejection apparatus) comprising same, according to one embodiment of the present invention will be described. FIG. 2 is a principal part cross-sectional diagram of an inkjet recording head (a cross-sectional diagram in the film thickness direction of the piezoelectric element). To clarify the illustration, the scale of the constituent elements is changed appropriately from the actual scale.

A piezoelectric actuator 2 according to the present embodiment has a piezoelectric element 1 where a lower electrode 20, a piezoelectric film 30 and an upper electrode 40 are laminated successively on a substrate 10, and a diaphragm 50 which vibrates due to expansion and contraction of the piezoelectric film 30 is attached to the rear surface of the substrate 10. In the piezoelectric element 1, an electric field is applied to the piezoelectric film 30 in the film thickness direction by the lower electrode 20 and the upper electrode 40, and the piezoelectric actuator 2 is also provided with a control device (not illustrated), such as a drive circuit which controls the driving of the piezoelectric element 1.

The lower electrode 20 is formed over substantially the whole surface of the substrate 10, the piezoelectric film 30 having a pattern where line-shaped projecting sections 31 are arranged in a stripe configuration is formed thereon, and the upper electrode 40 is formed on top of each projecting section 31.

The pattern of the piezoelectric film 30 is not limited to that shown, and is designed as appropriate. Furthermore, the piezoelectric film 30 may also be a continuous film. However, by forming the piezoelectric film 30 in a pattern comprising a plurality of projecting sections 31 which are mutually separated, rather than as a continuous film, the expansion and contraction of each of the projecting sections 31 are made smooth, which is desirable since a larger amount of displacement can be obtained.

There are no particular restrictions on the substrate 10, and possible examples of the substrate material are: silicon, silicon oxide, stainless steel (SUS), Yttrium-stabilized zirconia (YSZ), alumina, sapphire, SiC, $SrTiO_3$, or the like. The substrate 10 may employ a layered substrate, such as an SOT substrate in which an $SiO_2$ film and an Si active layer are layered successively on a silicon substrate.

There are no particular restrictions on the composition of the lower electrode 20, and metals or metal oxides such as Au, Pt, Ir, $IrO_2$, $RuO_2$, $LaNiO_3$, $SrRuO_3$, and the like, and combinations of these, are possible. There are no particular restrictions on the composition of the upper electrode 40, and the materials cited previously for the lower electrode 20, or electrode materials generally used in semiconductor processes, such as Al, Ta, Cr, Cu, or the like, and combinations of these, can be used. There are no particular restrictions on the thickness of the lower electrode 20 and the upper electrode 40, and the thickness of 50 to 500 nm is desirable.

As shown in FIG. 1A, the piezoelectric film 30 has respective coercive field points on the negative field side and the positive field side, and has asymmetrical bipolar polarization—electric field hysteresis characteristics in which the absolute value of the coercive electric field on the negative field side is different from the coercive field value on the positive field side. Provided that the piezoelectric film 30 is of this kind, there are no particular restrictions on the piezoelectric film 30. The piezoelectric film 30 is, for example, a piezoelectric film comprising one type or a plurality of types of perovskite oxide represented by the General Formula (P) given below, which is deposited on the substrate 10 by sputtering using a plasma (the piezoelectric film may include unavoidable impurities.) This piezoelectric film has piezoelectric characteristics in which the polarity of the coercive electric field having a smaller absolute value is negative and the P-E hysteresis is biased toward the positive field side.

$A_aB_bO_3$                                        General formula (P)

(In the Formula (P), A is an A site element of which the main component is Pb; B is a B site element, and is at least one type of element selected from the group comprising Ti, Zr, V, Nb, Ta, Cr, Mo, W, Mn, Sc, Co, Cu, In, Sn, Ga, Zn, Cd, Fe and Ni; O is oxygen; and a case where a≥1.0 and b=1.0 is standard, but these figures may deviate from 1.0 within a range where a perovskite structure is maintained.)

The perovskite oxide represented by the General Formula (P) described above may be lead titanate, lead titanate zirconate (PZT), lead zirconate, lead zirconate titanate niobate, or the like. The piezoelectric film may be a mixed crystal film of a perovskite oxide as represented by the General Formula (P) stated above.

In the present embodiment, a piezoelectric film comprising one type or a plurality of types of perovskite oxide represented by the General Formula (P-1) below is especially desirable (the piezoelectric film may include unavoidable impurities).

$Pb_a(Zr_{b1}Ti_{b2}X_{b3})O_3$                    General Formula (P-1)

(In the Formula (P-1), X is at least one type of metal element selected from the Group V and Group VI elements; a>0, b1>0, b2>0, b3≥0; and a case where a≥1.0 and b1+b2+b3=1.0 is standard, but these figures may deviate from 1.0 within a range where a perovskite structure is maintained.)

The perovskite oxide represented by the General Formula (P-1) above is lead zirconate titanate (PZT) if b3=0, and if b3>0, then an oxide in which a part of the B site of PZT is substituted with X which is at least one type of metal element selected from the Group V and Group VI elements.

X may be any metal element from Group VA, Group VB, Group VIA and Group VIB, and desirably, is at least one element selected from the group comprising V, Nb, Ta, Cr, Mo and W.

A piezoelectric film made of PZT oxide including a dopant which is represented by the General Formula (P-1) has a large bias rate to the positive field side in the P-E hysteresis characteristics, and therefore beneficial effects of using the driving method for the piezoelectric actuator according to the present embodiment can be achieved successfully.

Furthermore, as the larger the amount of lead, the bias rate of the piezoelectric film 30 made of perovskite oxide represented by General Formulas (P) and (P-1) above becomes greater. In the perovskite oxide represented by General Formulas (P) and (P-1), if the composition a of the lead is in the range of 1.02<a≤1.3, then the bias rate is 20% or above, and therefore it is possible successfully to obtain beneficial effects achieved by using the method of driving a piezoelectric actuator according to the present embodiment described above.

Consequently, in a piezoelectric film 30 made of a perovskite oxide represented by the General Formula (P-1), the greater the lead content, the greater the beneficial effects obtained by using the method of driving a piezoelectric actuator according to the present embodiment described above.

As described in the embodiments explained below, a piezoelectric film 30 made of a perovskite oxide represented by the General Formula (P) and (P-1) given above has a high piezoelectric distortion constant (d31 constant), and therefore the piezoelectric actuator 2 comprising this piezoelectric film 30 has excellent displacement characteristics.

Furthermore, as also indicated in the embodiment, the piezoelectric actuator having a piezoelectric film 30 made of a perovskite oxide represented by the General Formula (P) and (P-1) has voltage—displacement characteristics with excellent linearity in the range of the drive voltage. As stated previously, the voltage—displacement characteristics indicated in FIG. 1B of the embodiment show extremely high linearity of about 1%, and it is possible to improve effectively the driving durability and element reliability by means of the driving method for a piezoelectric actuator according to the present embodiment which is described above.

Furthermore, since the piezoelectric film 30 made of a perovskite oxide represented by the General Formula (P) and (P-1) contains lead, then lead migration occurs when the actuator is driven and the element characteristics are liable to decline, especially when used in high-temperature and high-humidity conditions. As stated previously, because the method of driving a piezoelectric actuator according to the present embodiment described above drives the actuator between a negative electric field and a positive electric field, then a beneficial effect in suppressing migration of lead ions is obtained. Consequently, by employing the driving method for a piezoelectric actuator according to the present embodiment above in a piezoelectric actuator comprising a piezoelectric film 30 made of perovskite oxide represented by the General Formulas (P) and (P-1), it is possible to reduce both deterioration due to lead migration as well as deterioration due to the load on the piezoelectric body, and therefore it is possible to improve the driving durability and element reliability of the actuator more effectively.

An inkjet recording head (liquid ejection apparatus) 3 has a structure where ink chambers (liquid storage chambers) 61 which store ink and ink nozzles (liquid storage ejection members) 60 having ink ejection ports (liquid ejection ports) 62 via which the ink is ejected to the exterior from the ink chambers 61 are attached to the rear surface of piezoelectric actuators 2. A plurality of the ink chambers 61 are provided in accordance with the number and pattern of the projecting sections 31 of the piezoelectric film 30. In the inkjet recording head 3, when the intensity of the electric field applied to a piezoelectric element 1 is increased or decreased, the piezoelectric element 1 expands or contracts, thereby controlling the ejection of ink from an ink chamber 61 and the ink ejection volume.

Instead of attaching the diaphragm 50 and ink nozzles 60 provided separately from the substrate 10, it is also possible to form and use a portion of the substrate 10 as the diaphragm 50 and ink nozzles 60. For example, if the substrate 10 is constituted by a layered substrate, such as an SOI substrate, then the ink chambers 61 are formed by etching the substrate 10 from the rear surface side, and it is possible to form the diaphragm 50 and ink nozzles 60 by processing the substrate itself.

The piezoelectric actuator 2 and the inkjet recording head 3 according to the present embodiment have the composition described above.

Inkjet Recording Apparatus

Figure 3:
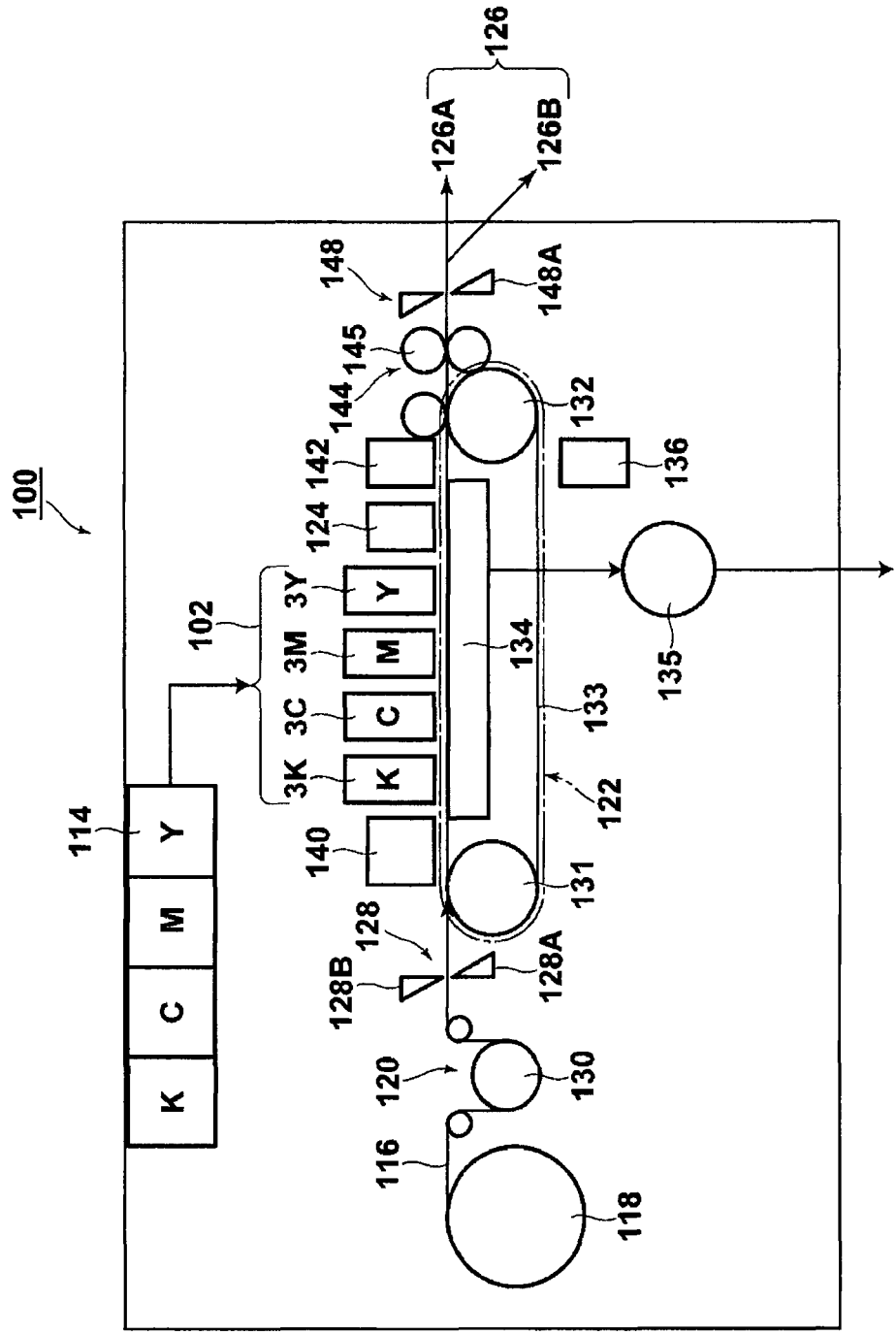
FIG. 3 is a diagram showing an example of the composition of an inkjet recording apparatus comprising the inkjet recording head shown in FIG. 2.
Figure 4:
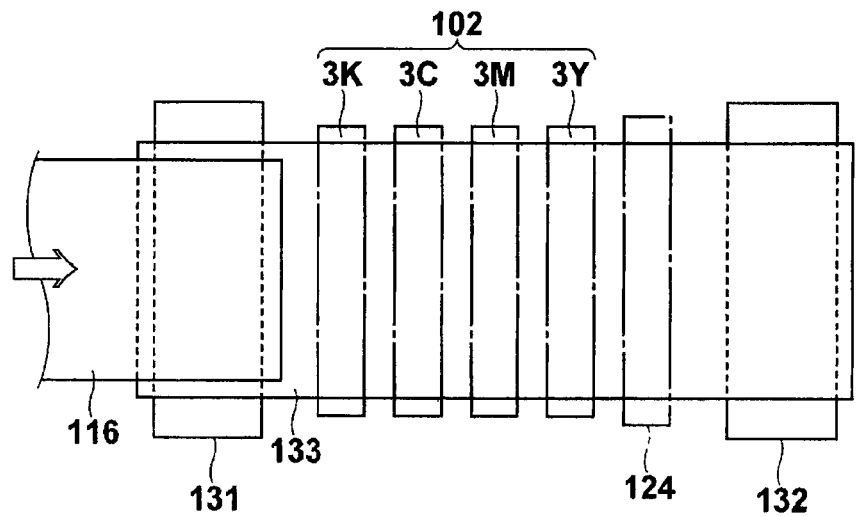
FIG. 4 is a partial plan view of the inkjet recording apparatus in FIG. 3.

An example of the composition of an inkjet recording apparatus comprising an inkjet recording head 3 according to the present embodiment will now be described with reference to FIG. 3 and FIG. 4. FIG. 3 is a general schematic drawing of an inkjet recording apparatus and FIG. 4 is a partial plan view of same.

The inkjet recording apparatus 100 shown comprises a print unit 102 having a plurality of inkjet recording heads (simply called "heads" below) 3K, 3C, 3M and 3Y which are provided to corresponding to respective colors of ink, an ink storing-loading unit 114 which stores inks to be supplied to the heads 3K, 3C, 3M and 3Y, a paper supply unit 118 which supplies recording paper 116, a decurling unit 120 which removes curl from the recording paper 116, a suction belt conveyance unit 122, disposed so as to oppose the nozzle surface (ink ejection surface) of the print unit 102, which conveys recording paper 116 while keeping the recording paper 116 flat, a print determination unit 124 which reads out the print results of the print unit 102, and a paper output unit 126 which outputs printed recording paper (a printed object) to the exterior of the apparatus.

The heads 3K, 3C, 3M and 3Y which constitute the print unit 102 are each inkjet recording heads 3 according to the embodiment described above.

In the decurling unit 120, heat is applied to the recording paper 116 by a heating drum 130 in the direction opposite to the curl direction, thereby decurling the paper.

In an apparatus which uses rolled paper, as shown in FIG. 3, a shearing cutter 128 is provided after the decurling unit 120, and the rolled paper is cut to a desired size by this cutter. The cutter 128 is constituted by a fixed blade 128A having a length equal to or greater than the width of the conveyance path of the recording paper 116 and a circular blade 128B which moves along the fixed blade 128A, the fixed blade 128A being provided in the rear surface side of the printing surface, and the circular blade 128B being provided across the conveyance path therefrom on the printing surface side. In an apparatus which uses cut paper, the cutter 128 is not necessary.

The recording paper 116 which has been decurled and cut is supplied to the suction belt conveyance unit 122. The suction belt conveyance unit 122 has a structure in which an endless belt 133 is wound about rollers 131 and 132 and is composed in such a manner that at least the portion of the endless belt 133 opposing the nozzle surface of the print unit 102 and the sensor surface of the print determination unit 124 is a horizontal surface (flat surface).

The belt 133 has a greater width dimension than the recording paper 116, and a plurality of suction apertures (not illustrated) are formed in the belt surface. A suction chamber 134 is provided to the inside of the belt 133 which is wrapped about the rollers 131 and 132, at a position facing the nozzle surface of the print unit 102 and the sensor surface of the print determination unit 124, and a recording paper 116 on the belt 133 is suctioned and held by creating a negative pressure in the suction chamber 134 by suctioning with a fan 135.

By transmitting the motive force of a motor (not illustrated) to at least one of the rollers 131, 132 about which the belt 133 is wound, the belt 133 is driven in the clockwise direction in FIG. 3 and the recording paper 116 held on the belt 133 is conveyed from left to right in FIG. 3.

Since ink adheres to the belt 133 when a marginless print job or the like is performed, a belt cleaning unit 136 is disposed in a predetermined position (a suitable position outside the printing area) on the exterior side of the belt 133.

A heating fan 140 is provided on the upstream side of the print unit 102 on the paper conveyance path formed by the suction belt conveyance unit 122. A heating fan 140 heats the recording paper 116 by blowing heated air onto the recording paper 116 before printing. By heating the recording paper 116 immediately before printing, the ink becomes more liable to dry after landing on the paper.

The print unit 102 includes so-called full line type heads (see FIG. 4) in which line heads each having a length corresponding to the maximum paper width are each arranged in a direction (the main scanning direction) which is perpendicular to the paper feed direction. The print heads 3K, 3C, 3M and 3Y are constituted as line heads in which a plurality of ink ejection ports (nozzles) are arranged through a length exceeding at least one edge of the recording paper 116 of maximum size which can be used in the inkjet recording apparatus 100.

The heads 3K, 3C, 3M and 3Y corresponding to respective colored inks are disposed in the order black (K), cyan (C), magenta (M) and yellow (Y), from the upstream side following the direction of conveyance of the recording paper 116. By ejecting colored inks respectively from the heads 3K, 3C, 3M and 3Y while conveying the recording paper 116, a color image is recorded on the recording paper 116.

The print determination unit 124 comprises a line sensor which captures an image of the droplet ejection results of the print unit 102, and the like, and determines ejection defects, such as nozzle blockages, from the droplet ejection image read in by the line sensor.

A post-drying unit 142 comprising a heating fan which dries the printed image surface, and the like, is provided in the stage after the print determination unit 124. It is desirable to avoid contact with the print surface until the ink after printing has been dried, and therefore a method which blows a heated air flow is desirable.

In order to control the luster of the image surface, a heating and pressurizing unit 144 is provided in the stage after the post-drying unit 142. In the heating and pressurizing unit 144, the image surface is pressurized by a pressurization roller 145 having a prescribed surface undulation shape and thereby an undulating shape is transferred to the image surface.

The printed material obtained in this way is output from the paper output unit 126. Desirably, a main image that is the object of the print operation (a print of the target image) and a test print are output separately. Desirably, the inkjet recording apparatus 100 comprises a selection device (not illustrated) which switches the paper output path in order to select a print of the main image and a test print and to supply same to the respective output sections 126A and 126B.

If a main image and a test print are printed simultaneously in parallel on a large sheet of paper, a cutter 148 should be provided to separate the portion of the test print.

The inkjet recording apparatus 100 has the composition described above.

Piezoelectric Ultrasonic Oscillator (Ultrasonic Transducer)

Figure 5:
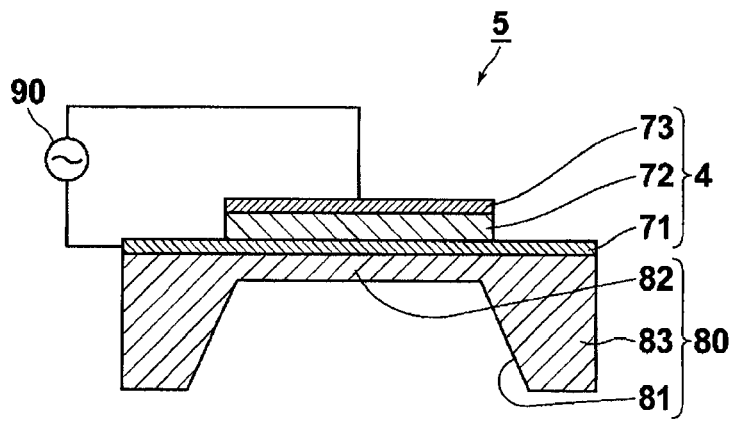
FIG. 5 is a cross-sectional diagram showing the structure of a piezoelectric ultrasonic oscillator according to one embodiment of the present invention.

The structure of a piezoelectric ultrasonic oscillator according to one embodiment of the present invention will now be described, with reference to FIG. 5. FIG. 5 is a principal cross-sectional diagram of a piezoelectric ultrasonic oscillator. To clarify the illustration, the scale of the constituent elements is changed appropriately from the actual scale.

The piezoelectric ultrasonic oscillator 5 according to the present embodiment is generally constituted by: an SOI substrate 80 having an open pool structure in which a cavity section 81, a diaphragm 82, and a supporting section 83 which supports the diaphragm 82, are formed in an integrated fashion by reactive ion etching (RIE) from the rear surface side; a piezoelectric element 4 which is formed on this substrate; and a Rf power source (high-frequency AC power source) 90 which applies a high-frequency AC current to electrodes 71 and 73 of the piezoelectric element 4. The piezoelectric element 4 has a layered structure comprising the lower electrode 71, a piezoelectric film 72 and the upper electrode 73, arranged from the substrate 80 side.

The composition and thickness of the lower electrode 71 and the upper electrode 73 are similar to the lower electrode 20 and the upper electrode 40 of the piezoelectric element 1 in FIGS. 1A to 1C. The piezoelectric film 72 is constituted by the columnar structure film according to an embodiment of the present invention.

When an AC electric signal in the ultrasonic range is applied to the electrodes 71, 73 of the piezoelectric element 4, a bending vibration is generated in the piezoelectric element 4 at the same frequency as the applied AC electric signal, and the diaphragm 82 performs a bending vibration in unison with the piezoelectric element 4. In this case, since the diaphragm 82 vibrates in a state where the peripheral edge portions thereof are supported by the supporting section 83, then an ultrasonic wave of the same frequency as the applied AC electric signal is radiated from the opposite side of the diaphragm 82 to the side of the piezoelectric element 4.

The piezoelectric ultrasonic oscillator 5 according to the present embodiment has the composition described above. According to the present embodiment, it is possible to provide a piezoelectric ultrasonic oscillator 5 having excellent voltage tolerance and excellent driving durability.

The piezoelectric ultrasonic oscillator 5 according to the present embodiment can be used in an ultrasonic motor, or the like.

The piezoelectric ultrasonic oscillator 5 according to the present embodiment can be used in a sensor which generates an ultrasonic wave of a particular frequency and detects the ultrasonic wave reflected back from an object, or the like, or can be used in an ultrasonic probe, or the like. When the diaphragm 82 vibrates due to receiving the ultrasonic wave reflected back from the object, the piezoelectric film 72 is displaced in accordance with the related stress and a voltage corresponding to the amount of this displacement is generated in the piezoelectric element 4. By determining this voltage, it is possible to determine the shape of the object, or the like.

Design Modifications

The present invention is not limited to the embodiments described above and the design thereof can be modified appropriately within a range that does not deviate from the essence of the present invention.

EXAMPLES

Examples relating to the present invention are described below.

First Example

A substrate with electrodes was prepared by successively layering a 150 nm-thick Ir lower electrode via a Ti adhesive layer, by sputtering, onto an SOI substrate in which a diaphragm structure was formed. Thereupon, a Nb-doped PZT film (Nb—PZT film) was formed to a thickness of 4 microns using a $Pb_{1.3}Zr_{0.43}Ti_{0.44}Nb_{0.13}O_3$ sintered body as a target, in a mixed $Ar/O_2$ atmosphere ($O_2$ volume fraction of 1.0%) at vacuum pressure 0.5 Pa, film forming temperature 525° C., input power 500 W, and substrate/target distance 60 mm In this case, the film was deposited with the substrate in a floating state and an earth provided at a position distant from the substrate that was not located between the target and the substrate. The composition of the film thus obtained was analyzed by XRF and found to be $Pb_{1.03}Zr_{0.43}Ti_{0.44}Nb_{0.13}O_3$.

Figure 6:
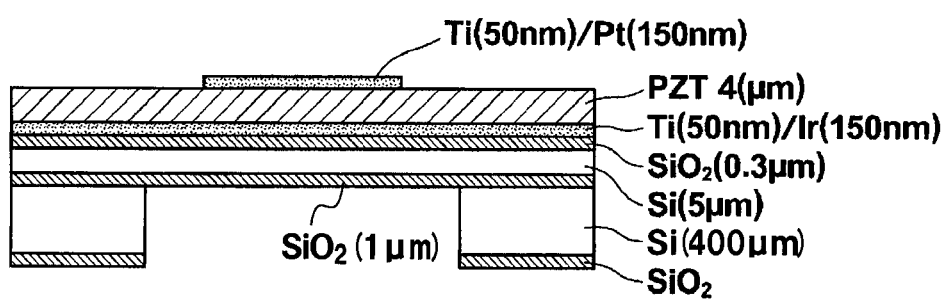
FIG. 6 is a schematic structural cross-section diagram of a piezoelectric element manufactured in an example.

Thereupon, an upper electrode of Pt was formed by sputtering via a Ti adhesive layer on the Nb—PZT film, and was patterned by a lift-off method to create a piezoelectric actuator (the thickness of each layer is shown in FIG. 6).

FIG. 1A shows the results of measuring the bipolar polarization—field characteristics (P-E hysteresis characteristics) of the piezoelectric actuator thus obtained. As shown in FIG. 1A, the obtained P-E hysteresis characteristics are asymmetrical with respect to the y axis indicating the polarization and are biased toward the positive field side, and the bias rate was 76%. In this case, the coercive electric field was 41.6 kV/cm in the positive direction and 5.8 kV/cm in the negative direction.

Thereupon, the bipolar field—displacement characteristics of the piezoelectric actuator thus created were measured, and the hysteresis shown in FIG. 1B was obtained. As shown in FIG. 1B, the Nb—PZT film was confirmed to have high linearity on the negative field side, and furthermore, was confirmed to have high linearity even at voltages below the coercive field on the positive side.

The piezoelectric actuator was then driven by applying a +5V bias voltage and inputting a square wave up to −26V. FIG. 1B shows the form of the input square wave in this case, together with the corresponding displacement of the diaphragm of the actuator (the details are described in the embodiments above).

As shown in FIG. 1B, with a drive voltage of −26V, it was possible to obtain a displacement corresponding to 31V. Furthermore, since the actuator could be driven with high linearity of 1% approximately, in the driving voltage range, then it was confirmed that a high amount of displacement can be obtained with high efficiency.

Moreover, driving durability was evaluated by driving the piezoelectric actuator continuously in 20 channels at 100 kHz, and under conditions of 40° C. and 80% RH. When the drive cycle at which 10 channels deteriorate was measured, taking the point of deterioration to be the point at which the induction tangent (tan δ) of the vibration surface of the piezoelectric actuator increases during the driving evaluation, exceptionally high driving durability of 100,000 million dots or more was obtained.

Furthermore, when the driving durability was evaluated similarly by setting a bias voltage of +10V and inputting a square wave up to −20V, a figure of 100,000 million dots or more was obtained for the drive cycle at which 10 channels deteriorated.

Second Example

Apart from adopting a target composition of $Pb_{1.3}Zr_{0.52}Ti_{0.48}O_3$, a piezoelectric actuator was manufactured similarly to the first example. The composition of the film thus obtained was analyzed by XRF and found to be $Pb_{1.01}Zr_{0.52}Ti_{0.48}O_3$. When the P-E hysteresis characteristics of the piezoelectric actuator thus obtained were measured, the bias rate was 13% (not shown in the drawings).

Figure 7:
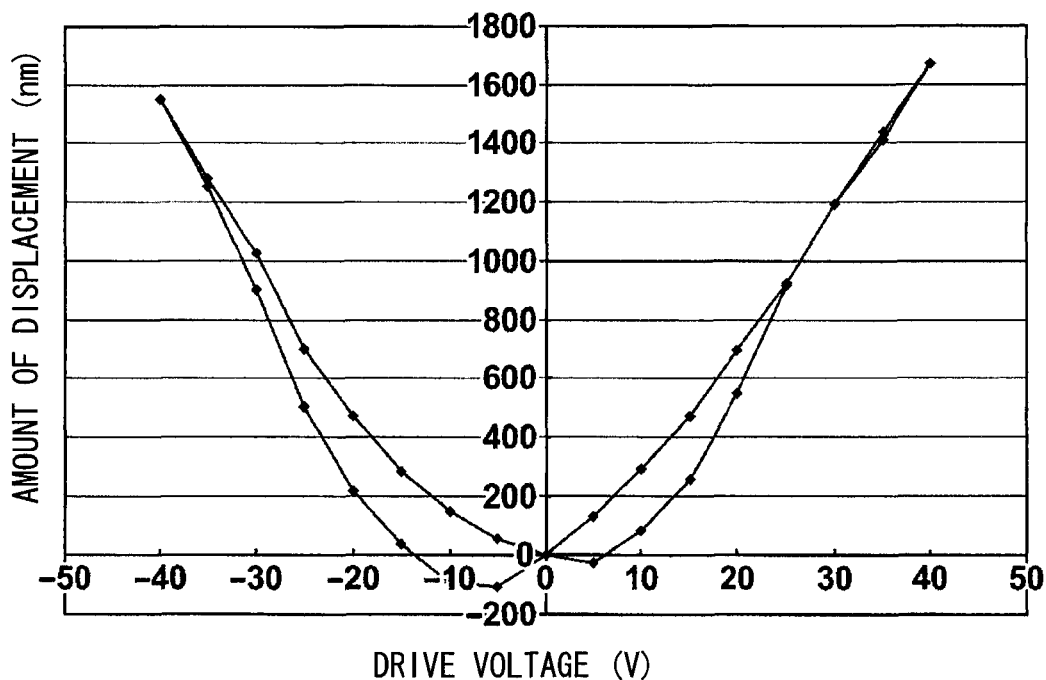
FIG. 7 is a diagram showing voltage—displacement characteristics when a piezoelectric actuator according to a second example is driven.
Figure 8:
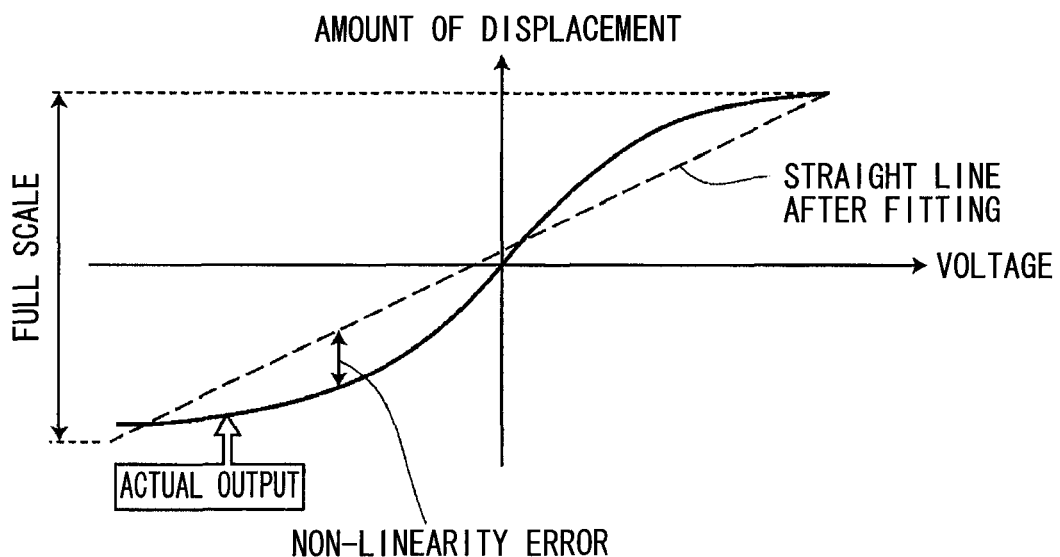
FIG. 8 is a diagram describing a method for evaluating linearity in the present invention.

Furthermore, the bipolar field—displacement characteristics of the piezoelectric actuator were measured and the hysteresis shown in FIG. 7 was obtained. As shown in FIG. 7, since the displacement on the positive field side is extremely small and the lead content is low compared to the first example, then in the piezoelectric actuator having these electric field—displacement characteristics, although slight beneficial effects were obtained, it was confirmed that beneficial effects of adopting the driving method for a piezoelectric actuator according to the present invention were very small indeed.

Comparative Example 1

The piezoelectric actuator manufactured according to the first example was driven similarly by inputting a −26V square wave without applying a bias voltage (see FIG. 1C). As a result of this, it was confirmed that the amount of displacement obtained is approximately 80% of that obtained in the first example.

Next, the driving durability was evaluated in a similar manner to the first example. As a result of this, the drive cycle at which 10 channels deteriorated was found to be 20,000 million dots.

Comparative Example 2

The piezoelectric actuator manufactured in the first example was driven similarly by applying a bias voltage in the vicinity of the coercive electric field of +12V to the actuator. As a result of this, a smaller displacement than the range obtained in the second example was achieved, and the driving characteristics became unsatisfactory.

INDUSTRIAL APPLICABILITY

The method for manufacturing a piezoelectric film according to the present invention can be applied desirably to a piezoelectric element, piezoelectric ultrasonic oscillator and piezoelectric electric power generating element, and the like, which are mounted in an inkjet recording head, a magnetic recording and reproduction head, a MEMS (Micro Electro-Mechanical Systems) device, a micro-pump, an ultrasonic probe, an ultrasonic motor, or the like, or in a ferroelectric element, such as a ferroelectric memory, or the like.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method of driving a piezoelectric actuator including: a piezoelectric element containing a piezoelectric body having a negative side coercive field point and a positive field side coercive field point, the piezoelectric body having asymmetrical bipolar polarization—electric field hysteresis characteristics in which an absolute value of the negative field side coercive field point and an absolute value of the positive field side coercive field point are different, a coercive field value being whichever of the negative side coercive field point and the positive side coercive field point has a larger absolute value, and a pair of electrodes for applying voltage to the piezoelectric body; and a diaphragm which externally transmits, as displacement, distortion produced in the piezoelectric body when the voltage is applied to the piezoelectric body, the method comprising the step of driving the piezoelectric actuator between a positive drive voltage and a negative drive voltage only in a range not exceeding the coercive field value.

2. The method of driving a piezoelectric actuator as defined in claim 1, wherein the piezoelectric actuator is driven while a drive voltage having a polarity of the coercive field value is constantly applied to the piezoelectric body as a bias voltage.

3. The method of driving a piezoelectric actuator as defined in claim 1, wherein the piezoelectric actuator is driven between a first drive voltage Vc1 and a second drive voltage Vc2 under conditions satisfying |Vc1|<|Vc2| where Vc1 has a polarity of the coercive field value, and Vc2 has a polarity of whichever of the negative side coercive field point and the positive side coercive field point has a smaller absolute value.

4. The method of driving a piezoelectric actuator as defined in claim 3, wherein the piezoelectric actuator is driven under conditions satisfying |Vc1|≤0.7×|V1| where V1 denotes a product of the coercive field value and a thickness of the piezoelectric body in a direction of application of voltage.

5. The method of driving a piezoelectric actuator as defined in claim 1, wherein the piezoelectric body contains Pb.

6. The method of driving a piezoelectric actuator as defined in claim 1, wherein the piezoelectric actuator is driven in a mode where a direction of application of voltage to the piezoelectric body and a direction of expansion and contraction of the piezoelectric body are mutually perpendicular.

7. The method of driving a piezoelectric actuator as defined in claim 1, wherein the voltage applied to the piezoelectric body has a square waveform.

8. The method according to claim 3, wherein a magnitude of Vc2 is larger than the magnitude of whichever of the negative side coercive field point and the positive side coercive field point has a smaller absolute value.

9. The method according to claim 3, wherein a magnitude of Vc1 is smaller than the coercive field value.

10. The method according to claim 1, wherein the piezoelectric actuator is driven between a positive drive voltage and a negative drive voltage in a range that exceeds whichever of the negative side coercive field point and the positive side coercive field point has a smaller absolute value.

* * * * *

UNITED STATES PATENT AND TRADEMARK OFFICE
CERTIFICATE OF CORRECTION

PATENT NO. : 8,562,112 B2  
APPLICATION NO. : 12/892904  
DATED : October 22, 2013  
INVENTOR(S) : Takamichi Fujii et al.

Page 1 of 1

It is certified that error appears in the above-identified patent and that said Letters Patent is hereby corrected as shown below:

<u>On the Title page, and in the Specification, column 1, line 4, title</u>:
Delete "OSICLLATOR" and insert -- OSCILLATOR --, therefor.

Signed and Sealed this
Thirteenth Day of May, 2014

Michelle K. Lee
*Deputy Director of the United States Patent and Trademark Office*